US009988197B2

United States Patent
Simonsen et al.

(10) Patent No.: US 9,988,197 B2
(45) Date of Patent: Jun. 5, 2018

(54) PACKAGE SYSTEM FOR PACKAGING AND ADMINISTERING CONTROLLED DOSAGES OF CHEMICAL AGENTS

(71) Applicant: Arch Chemicals, Inc., Allendale, NJ (US)

(72) Inventors: Fred Simonsen, Allendale, NJ (US); Karen Boyd, Allendale, NJ (US); John Puetz, Allendale, NJ (US)

(73) Assignee: ARCH CHEMICALS, INC., Allendale, NJ (US)

( * ) Notice: Subject to any disclaimer, the term of this patent is extended or adjusted under 35 U.S.C. 154(b) by 22 days.

(21) Appl. No.: 15/319,922

(22) PCT Filed: Jun. 17, 2015

(86) PCT No.: PCT/US2015/036114
§ 371 (c)(1),
(2) Date: Dec. 19, 2016

(87) PCT Pub. No.: WO2015/195727
PCT Pub. Date: Dec. 23, 2015

(65) Prior Publication Data
US 2017/0152093 A1 Jun. 1, 2017

Related U.S. Application Data

(60) Provisional application No. 62/015,053, filed on Jun. 20, 2014.

(51) Int. Cl.
*B65D 65/00* (2006.01)
*B65D 75/58* (2006.01)
(Continued)

(52) U.S. Cl.
CPC ......... *B65D 75/5805* (2013.01); *B65D 65/42* (2013.01); *B65D 65/46* (2013.01);
(Continued)

(58) Field of Classification Search
USPC ............ 206/484, 484.1, 484.2, 524.1, 524.2, 206/524.9, 524.4, 524.5, 524.6, 524.7
See application file for complete search history.

(56) References Cited

U.S. PATENT DOCUMENTS

| 4,374,563 A | * | 2/1983 | Alexander | ............. B65D 71/10 206/0.5 |
| 4,876,003 A | * | 10/1989 | Casberg | .................... B01F 1/00 206/5 |

(Continued)

FOREIGN PATENT DOCUMENTS

DE 20 2012 004 998 U1 8/2012

OTHER PUBLICATIONS

PCT/US2015/036114 International Search Report and Written Opinion dated Dec. 21, 2015, 11 pages.

*Primary Examiner* — Jacob K Ackun
(74) *Attorney, Agent, or Firm* — Dority & Manning, PA (57) ABSTRACT

A package system is disclosed for dispensing controlled amounts of a chemical agent. The package system includes an outer package that is generally gas and liquid impermeable. The outer package contains an inner package made from a degradable material, such as a material that is water degradable. The inner package contains a measured amount of a chemical agent. The chemical agent may be difficult to handle and may have corrosive properties, may be an oxidizer, or the like. The package system facilitates dispensing the chemical agent into a particular environment. In one embodiment, the package system is designed to hold a chemical agent for treating recreational water sources, such as swimming pools.

22 Claims, 4 Drawing Sheets

(51) Int. Cl.
  *B65D 65/46* (2006.01)
  *B65D 75/30* (2006.01)
  *B65D 75/38* (2006.01)
  *B65D 65/42* (2006.01)
  *C23C 14/00* (2006.01)
  *C23C 14/26* (2006.01)
  *C23C 14/30* (2006.01)
  *C02F 1/68* (2006.01)
  *C02F 1/72* (2006.01)
  *C02F 1/50* (2006.01)
  *C02F 5/00* (2006.01)
  *E04H 4/12* (2006.01)
  *C02F 103/42* (2006.01)

(52) U.S. Cl.
  CPC ............ *B65D 75/30* (2013.01); *B65D 75/38* (2013.01); *C02F 1/50* (2013.01); *C02F 1/687* (2013.01); *C02F 1/722* (2013.01); *C02F 5/00* (2013.01); *C23C 14/0021* (2013.01); *C23C 14/26* (2013.01); *C23C 14/30* (2013.01); *E04H 4/1281* (2013.01); *C02F 2103/42* (2013.01); *C02F 2303/04* (2013.01)

(56) References Cited

U.S. PATENT DOCUMENTS

| | | |
|---|---|---|
| 4,886,615 A | 12/1989 | Dehan |
| 5,222,595 A | 6/1993 | Gouge et al. |
| 5,401,546 A * | 3/1995 | Meattle ............ B32B 27/08 428/35.2 |
| 5,403,096 A | 4/1995 | Aaaesen |
| 5,407,567 A * | 4/1995 | Newhard ............ B01F 1/0033 206/501 |
| 5,511,665 A | 4/1996 | Dressel et al. |
| 6,478,763 B1 | 11/2002 | Simonsen et al. |
| 6,607,696 B1 * | 8/2003 | Hamilton ............ A61L 2/20 134/6 |
| 7,607,834 B2 | 10/2009 | Alvater et al. |
| 2010/0236090 A1* | 9/2010 | Grimm ............ B65D 1/0215 34/296 |
| 2015/0203275 A1* | 7/2015 | May ............ B05C 17/00553 206/219 |

* cited by examiner

PACKAGE SYSTEM FOR PACKAGING AND ADMINISTERING CONTROLLED DOSAGES OF CHEMICAL AGENTS

RELATED APPLICATIONS

This present application claims priority to PCT International Patent Application No. PCT/US2015/036114 having a filing date of Jun. 17, 2015, and U.S. Provisional Application No. 62/015,053 filed on Jun. 20, 2014, which are all hereby incorporated by reference in their entirety.

BACKGROUND

Many different package designs exist for containing different types of compositions. One problem that continues to exist, however, is the ability to design a package that is capable of dispensing liquids, gels, creams, dispersions, pastes, granular materials, and other types of fluid or semi-fluid compositions in a controlled and easy to use fashion. In particular, problems have been experienced in efficiently dispensing the product from flexible packages. Further, problems have been experienced in designing easy to open packages that will not rupture during storage and transportation.

The above problems become exacerbated when attempting to ship and package chemical agents. For example, many chemical agents have corrosive properties, oxidizing properties, are strongly acidic, are strongly alkaline, or the like. Consequently, these chemical agents can degrade during storage, can degrade the package in which they are kept, or can present various other problems. In this regard, many chemical agents are packaged and shipped in expensive containers in large quantities.

For example, chemicals used to treat swimming pools are typically packaged in relatively large rigid and flexible polymer containers of various sizes. Pool owners and pool attendants must then dispense measured and controlled amounts of the chemicals for application to the swimming pool water. Over application or under application of these chemical agents can lead to adverse conditions that lead to a swimming pool that does not have clear water, is out of pH balance, or the like. Further, spills can also result when attempting to dispense the chemical agents from the containers.

In view of the above, a need exists for an improved packaging system for chemical agents. More particularly, a need exists for a packaging system for chemical agents that can protect the chemical agents during storage and shipping and that can be easily dispensed by a consumer.

SUMMARY

In general, the present disclosure is directed to a packaging system for chemical agents. As will be explained in greater detail below, the package system of the present disclosure is well suited to providing and maintaining a positive internal atmosphere for a chemical agent, for maintaining efficacy of the chemical agent and for easily dispensing a measured dose of the chemical agent.

In one embodiment, for instance, the package system of the present disclosure is for administering controlled dosages of a chemical. The package system includes an outer package and at least one inner package. The inner package is contained within the outer package.

The outer package comprises a first film layer attached to a second film layer. The outer package has a periphery surrounding a compartment that has an interior volume. The first film and the second film are attached together at the periphery. The first film and the second film have a moisture or water vapor transmission rate of less than about 0.2 g/100 in$^2$/24 hrs., such as less than about 0.15 g/100 in$^2$/24 hrs. The first film and the second film can also have an oxygen transfer rate of less than about 0.5 cc/100 in$^2$/24 hrs., such as less than about 0.45 cc/100 in$^2$/24 hrs.

At least one inner sealed package is contained in the compartment of the outer package. The inner package is degradable when exposed to a degrading agent. For instance, the inner package can be water degradable. The inner package contains a measured amount of a chemical agent. The outer package maintains a non-degrading environment for the inner package and the chemical agent.

In one embodiment, in order to easily open the outer package, the outer package can include a tear promoting portion. A user, for instance, can tear open the outer package at the tear promoting portion in order to dispense the inner sealed package. In one embodiment, the outer package can include a stop member that is positioned in the package in relation to the tear promoting portion such that the stop member inhibits further tearing of the package in order to prevent the package from tearing into two pieces.

The outer package can be made from various materials, particularly polymer materials. For instance, the first film and the second film can be made from a polyester, such as polyethylene terephthalate, polypropylene, polyethylene, polyvinylidene chloride, or mixtures thereof. In one embodiment, the first film and the second film are comprised of oriented polymer films, such as biaxially oriented polymer films. For example, in one particular embodiment, the first film and the second film comprise biaxially oriented polypropylene films.

The first film and the second film can be attached together in any suitable manner. In one embodiment, the first film and the second film are attached together using an adhesive material. The adhesive material may comprise, in one embodiment, a laminated structure comprised of cross-oriented multiple layers of polymer materials. The cross-oriented layers may comprise polypropylene, polyethylene, polystyrene, or mixtures thereof. Each film can have a thickness of generally from about 2 mils to about 10 mils, such as from about 2 mils to about 5 mils.

The inner package, on the other hand, can be made from any suitable material capable of degrading when exposed to a desired degrading agent. For instance, the inner package can be made from polyvinyl alcohol which is water degradable. Polyvinyl alcohol is also well suited to holding various chemical agents.

The chemical agent may comprise an oxidizer such as a peroxide, a biocide such as an algaecide, a corrosive agent, a softener, a clarifier, a fragrance, or any other suitable water maintenance or sanitation product. The chemical agent can be in the form of a liquid, a gel and/or a solid. The solid, for instance, may be semi-fluid, such as a granular material or a powder material. In one embodiment, the chemical agent comprises a chemical for treating swimming pools. For example, in one particular embodiment, the chemical agent comprises 2,2-dibromo-2-cyanoacetamide.

As described above, the inner package contains a desired amount of the chemical agent. The chemical agent, for instance, can have a mass of from about 2 grams to about 500 grams, such as from about 2 grams to about 110 grams. The amount of chemical agent contained within the inner package may comprise a single dose of the chemical agent for a particular application. In an alternative embodiment, the outer package can contain many inner packages. Each inner package can contain a sub-dose of the chemical agent. One or more inner packages can then be combined to produce a single dose for use in an application.

Other features and aspects of the present disclosure are discussed in greater detail below.

DEFINITIONS

As used herein, moisture vapor transmission rate is measured according to ASTM Test F1249-13.

As used herein, oxygen transfer rate is measured according to ASTM Test D3985-05(2010)E1.

A package that is degradable is one that will degrade when contacted with a degrading agent within at least one day, such as less than eight hours, such as less than four hours, such as less than one hour, such as less than 30 minutes, such as less than 15 minutes. A package has degraded when the package ruptures or opens due to the degrading agent and the contents of the package have been released. A degrading agent is any agent present in the environment that causes a package to degrade. The degrading agent may be a liquid or solvent, such as water, a gas such as oxygen, or the like. The degrading agent can also be temperature, pH, and the like. In one embodiment, the degradable package is designed to completely dissolve when left in an environment containing the degrading agent.

BRIEF DESCRIPTION OF THE DRAWINGS

A full and enabling disclosure of the present disclosure is set forth more particularly in the remainder of the specification, including reference to the accompanying figures, in which.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only, and is not intended as limiting the broader aspects of the present disclosure.

In general, the present disclosure is directed to a package system for administering controlled amounts or dosages of a chemical agent. More particularly, the package system of the present disclosure is directed to dispensing controlled amounts of a chemical agent that has oxidizing properties, is acidic or alkaline, has corrosive properties, or is otherwise difficult to store and handle without degradation of the product and/or is capable of adversely interacting with the environment. The properties of the chemical agent can be mild or can be severe. For instance, the chemical agent can have stable or less corrosive properties or can be highly corrosive.

The package system of the present disclosure generally contains an outer package and an inner package. The inner package contains a controlled amount or dose of the chemical agent. In one embodiment, the inner package is degradable when contacted with a degrading agent. Consequently, the inner package can be dispensed into an environment. Over time, the inner package then degrades releasing the chemical agent in the controlled amount without ever having to directly handle the chemical agent or measure the amount necessary to dispense.

The outer package, on the other hand, maintains a non-degrading environment for the inner package and the chemical agent. Thus, the outer package is made from materials having particular properties, such as gas and fluid permeability requirements. The outer package is also constructed such that the outer package will not rupture during shipping and storing. In one embodiment, the outer package can also be constructed so that it can be easily opened by a consumer.

The package system of the present disclosure provides various advantages and benefits. For example, the package system of the present disclosure provides the ability to maintain efficacy of a measured dose of a chemical agent and is completely compatible with various chemical agents, including corrosive agents, oxidizers such as peroxides, pesticides such as algaecides, and the like. The packaging system also provides protection against unwanted environmental exposure of the chemical agent and unwanted human exposure to the chemical agent during dispensing or application of the chemical agent. The packaging system of the present disclosure also prevents against application errors. For example, over dosing or under dosing of the chemical agent can have many adverse consequences on the system that is being treated. The packaging system prevents against unwanted spills and can protect the chemical agent from contact with moisture, gas, heat and the like during storage.

The package system of the present disclosure can be configured to be tamper evident and child resistant. Even though the packaging system is child resistant, tamper evident, and puncture resistant, the packaging system can also be configured to be easily opened by the consumer. For instance, the outer package can include a tear promoting portion that allows access to the inner package without the use of a mechanical apparatus, such as scissors.

The packaging system of the present disclosure also provides various improvements over conventional packaging methods for chemical agents. For instance, depending upon the application, less packaging material by weight may be needed in order to package and dispense the chemical agent. Transportation and distribution costs can also be lowered in comparison to many existing bulk systems. The packaging system can also be made from a transparent or translucent film that allows for a recognition of the contents. In addition, the transparent or translucent film can indicate whether the inner pouch has been inadvertently punctured prior to dispensing the contents.

Figure 1:
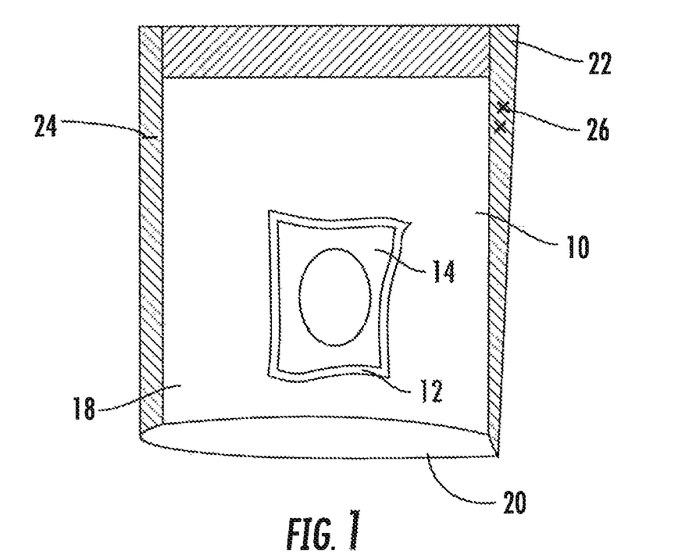
FIGS. 1, 2 and 3 represent one embodiment of a package system made in accordance with the present disclosure.
Figure 2:
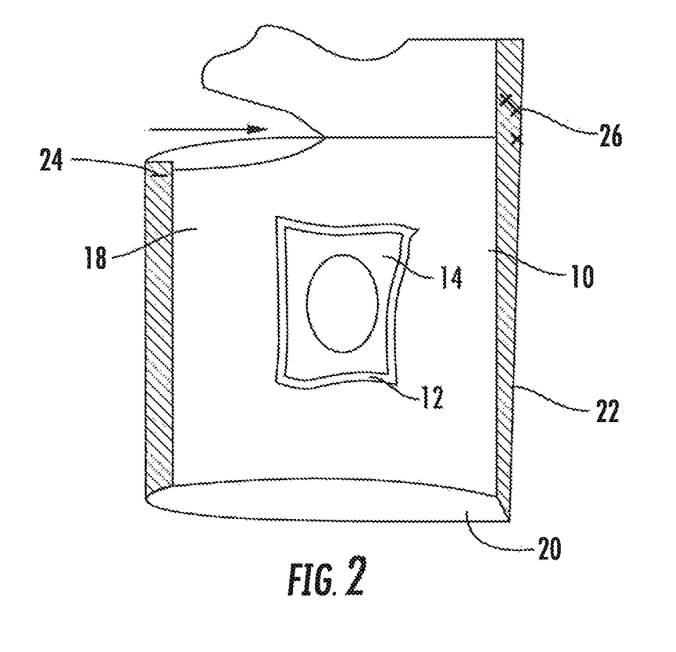
Figure 3:
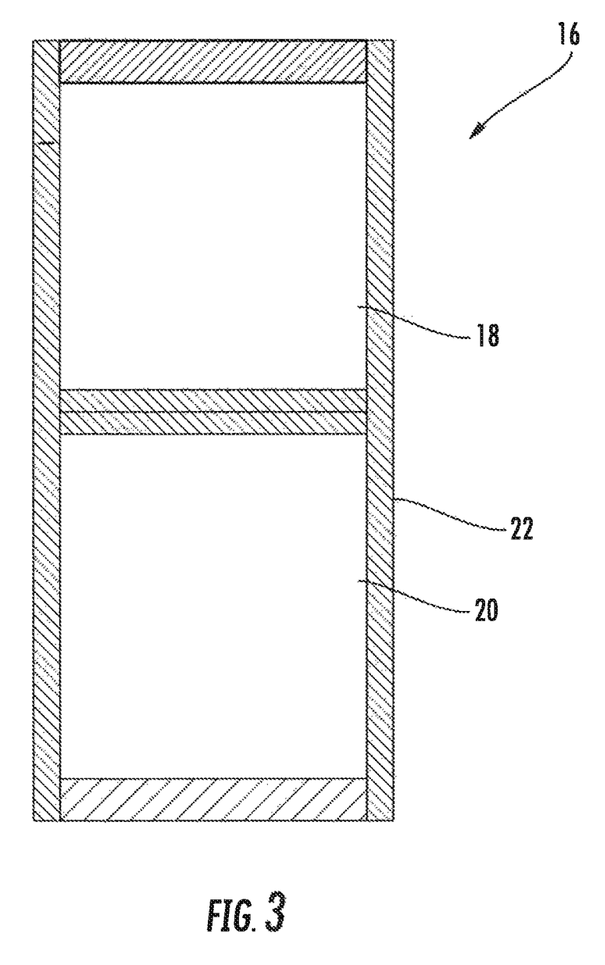

Referring to FIGS. 1-3, one embodiment of a packaging system made in accordance with the present disclosure is shown. As illustrated in FIG. 1, the packaging system includes an outer package 10 that holds an inner package 12. The inner package contains a controlled amount of a chemical agent 14.

A flat 16 that may be used to form the outer package 10 is illustrated in FIG. 3. As shown, the outer package 10 is formed from a first film 18 and a second film 20 that can have the same construction and properties or can have a different construction and properties. The first film 18 and the second film 20 may be flexible polymer films in one embodiment. The first film 18 and the second film 20 may be portions of a singular sheet of flexible polymer film. Alternatively, the first film 18 and the second film 20 may be separate sheets of flexible polymer films. It should be understood that the outer package 10 can have any suitable shape depending upon various factors including the type of product contained in or to be received in the package.

The first film 18 and the second film 20 can be made from any suitable polymer. The films, however, should be made from one or more polymers in a manner that protects the inner package 14 and its contents. In particular, films should be selected that maintain a protective environment for the inner package 12 and the chemical agent 14. Polymers that may be used to form the polymer films 18 and 20 include, for instance, polyolefins such as polyethylene and polypropylene, polyesters such as polyethylene terephthalate, vinyl polymers, such as polyvinylidine chloride, mixtures thereof, copolymers thereof, and the like.

In one embodiment, the first film 18 and the second film 20 can be made from an oriented polymer film. The film can be oriented in one direction or can be oriented in two directions (known as biaxially oriented). Orienting the film can improve the permeability properties of the film, making the film less permeable to fluids, such as liquids, gases and vapors.

In one particular embodiment, for instance, the first film 18 and the second film 20 are made from biaxially oriented polyolefin films, such as biaxially oriented polypropylene films. Biaxially oriented polypropylene films, for instance, can be formed from a polypropylene resin that contains a crystalline polypropylene. The crystalline polypropylene, for instance, can have a density of from about 0.88 to about 0.92 g/cc. In addition to a crystalline polypropylene, the film may also contain various other polymers, such as a polypropylene copolymer, a polypropylene resin, and the like. The polypropylene copolymer may comprise an alpha olefin polypropylene copolymer.

In order to biaxially orient the film, the film can first be oriented in the machine direction and then oriented in the cross-machine direction. For example, the film can be stretched in the machine direction from about three to about ten times its original length, such as from about four times to about eight times its original length. In the cross-machine direction, the film can be stretched from about five times to about fifteen times its original length, such as from about five times to about twelve times its original length.

In addition to polypropylene films, polyester films and polystyrene films can also be biaxially oriented similar to the process described above.

The first film 18 and the second film 20 can each comprise a single layer of material or can comprise multiple layers. In one embodiment, for instance, the first film 18 and the second film 20 can include a core layer of polymeric material coated on one or both sides with other functional polymer layers. The other functional polymer layers, for instance, can comprise, for instance, a gas barrier layer such as an oxygen barrier layer, an adhesive layer, an ultraviolet light filter layer, an anti-blocking layer, one or more printed layers, a primer layer for receiving printed matter, a moisture barrier layer, and the like.

In one embodiment, at least one of the first film or the second film comprises a metalized film layer. For instance, the film may comprise a polyester film that contains a metal layer, such as an aluminum layer applied through chemical vapor deposition.

The coating applied to the films can be applied using any suitable process. For instance, the coating can be applied using reactive evaporation, thermal evaporation, plasma evaporation, electron beam evaporation, and/or vacuum deposited.

The first film 18 and the second film 20, in one embodiment, can be transparent, translucent and/or opaque. If transparent or translucent, the contents of the outer package can be visually inspected prior to opening the package. For instance, visual inspection can reveal whether the inner package has ruptured prior to opening the package. In other embodiments, however, the first film and the second film can be opaque. For example, in certain embodiments, it may be desired to shield the chemical agent from light.

As described above, the outer package can include various printed matter. In one embodiment, for instance, the outer package can display various graphics that identify the chemical agent inside and the brand. Directions for use, precautions, and other instructions can also be printed on the package.

The first film 18 and the second film 20 are sealed together to form a compartment defining an interior volume. The first film 18 and the second film 20 may be sealed together using any suitable sealing technique. The films are generally sealed about the periphery of the outer package. The films can be sealed together using, for instance, thermal bonding, ultrasonic bonding, and the like. Alternatively, the films can be sealed together using an adhesive material or mechanically sealed.

In the embodiment illustrated in FIGS. 1-3, the first film 18 and the second film 20 are sealed together using an adhesive material 22. As shown in FIG. 3, the adhesive material 22 can be applied around the periphery of each film. In one embodiment, the adhesive material can be printed onto the films. In other embodiments, however, the adhesive may be extruded onto the films, sprayed on the films, or applied using any suitable manner. In the embodiment illustrated in FIGS. 1-3, the adhesive material forms a seam around at least three sides of the outer package 10.

An adhesive material should be selected that forms a sealed package wherein the seams of the package maintain the properties of the first film 18 and the second film 20. Consequently, the adhesive material 22 should form a seam that does not rupture and is gas and moisture impermeable. In one embodiment, the adhesive material 22 may comprise one or more polymer layers applied to the first film 18 and the second film 20. For instance, the adhesive material may comprise a polyolefin, such as a polyethylene or a polypropylene. In an alternative embodiment, the adhesive material may comprise a polystyrene.

In one embodiment, the adhesive material 22 can be formed from a low density polyethylene, a linear low density polyethylene, an ionomer resin such as SURLYN (commercially available from DuPont) or other suitable material.

In one embodiment, the adhesive material comprises a cross-laminated film. For instance, the adhesive material may comprise a core layer that is the primary structural layer and provides tear resistance, an inner layer that provides moisture resistance, and an outer layer that may be used to increase puncture resistance. In one embodiment, the adhesive material comprises a molecularly-oriented material, such as polypropylene, polyethylene or polystyrene, oriented by methods such as stretching in a predetermined direction. The different layers of the adhesive material may be oriented in different directions which further enhances the tear resistance of the material. Oriented polymers, when cross-laminated, are highly resistant to tearing. In one embodiment, the oriented material may comprise a high density polyethylene.

The outer package 10 is constructed so as to protect the inner package 12 and the chemical agent 14. Each film 18 and 20 and the overall package should therefore have protective properties depending on the chemical agent being contained in the inner package. For example, the films 18 and 20 and the package 10, in one embodiment, can have a water vapor transfer rate of less than about 0.5 cc/100 in$^2$/24 hrs., such as less than about 0.15 cc/100 in$^2$/24 hrs. In one particular embodiment, for instance, the films and package have a water vapor transmission rate of from about 0.05 g/100 in$^2$/24 hrs. to about 0.13 g/100 in$^2$/24 hrs.

The films and package can have an oxygen transfer rate of less than about 0.5 cc/100 in$^2$/24 hrs., such as less than about 0.45 cc/100 in$^2$/24 hrs. In one embodiment, the oxygen transfer rate can be from about 0.01 cc/100 in$^2$/24 hrs. to about 0.45 cc/100 in$^2$/24 hrs.

Each film can generally have a thickness of from about 0.5 mils to about 10 mils. The films can have the same thickness or can have different thicknesses. The films generally have a thickness of less than about 8 mils, such as less than about 5 mils. In one embodiment, the films have a thickness of from about 2.5 mils to about 5 mils. The thickness of the adhesive material can vary depending upon the type of adhesive used. When the adhesive material comprises a laminated structure, the adhesive can have a thickness of less than about 10 microns, such as less than about 8 microns. For instance, the adhesive material can have a thickness of from about 1 micron to about 7 microns.

The first film 18 and the second film 20 can be sealed together so as to be tamper evident and child resistant. In one embodiment, the outer package 10 can include a tear promoting portion 24 that allows the package to be easily opened by a consumer as shown in FIG. 2. The tear promoting portion 24 may comprise a score line, a notch, or a point of weakness along the periphery of the package. The tear promoting portion 24 and the outer package 10 can be configured such that the package tears in a linear manner. In one embodiment, for instance, the package may tear in a direction parallel and or horizontal to the top or bottom of the package.

In one embodiment, the tear promoting portion 24 allows the outer package 10 to be torn along a line. In order to prevent the torn portion from separating from the package, the outer package 10 can further include a stop member 26. The stop member 26 can comprise any suitable permanent seal that prevents the package from tearing into two pieces. The stop member 26 can be an additional reinforcement added to the package at a particular location, or may comprise the seam located opposite the tear promoting portion 24, if the seam is constructed with sufficient strength.

The outer package 10 of the package system is constructed such that the chemical agent 14 contained in the inner package 12 is contained in a positive internal atmosphere. The outer package 10 also protects the inner package 12 and the chemical agent 14 from external elements such as oxygen, moisture, heat and the like. The outer package 10 minimizes gas transference and aroma development. The inner package 12 is generally formed from a degradable material. The outer package 10 protects the inner package 12 so that the inner package 12 degrades or dissolves within a desired timeframe, even after long term storage within the outer package.

In one embodiment, the interior volume of the outer package 10 may have a controlled atmosphere. For instance, the interior volume of the compartment of the outer package 10 may contain an inert gas at a desired pressure in order to further protect the inner package 12 and the chemical agent 14. The inert gas may comprise, for instance, nitrogen, a noble gas, or may comprise a gas mixture that is low in oxygen content. For instance, oxygen present within the outer package can be at levels less than 5% by volume, such as less than 2% by volume, such as less than 1% by volume.

As shown in FIGS. 1-3, the inner package 12 can be made from a polymer film that degrades when exposed to a degrading agent. The degrading agent can vary depending upon the chemical agent 14 contained in the inner package 12 and the environment in which the chemical agent 14 is used. The inner package 12 may degrade, for instance, when contacted with a gas or liquid. The gas may comprise oxygen, carbon dioxide, or other suitable gas. Examples of liquid degrading agents include water or any other suitable solvent.

In one embodiment, the inner package 12 is made from a polyvinyl alcohol film. Polyvinyl alcohol films are water soluble, but are also resistant to many chemical agents. As shown in FIGS. 1 and 2, in one embodiment, the inner package 12 can be made from two polymer films that are sealed at their edges to form a seam.

In the embodiment illustrated in FIGS. 1 and 2, the outer package 10 contains a single inner package 12. It should be understood, however, that the outer package 10 can contain a plurality of inner packages.

Many different chemical agents may be contained in the package system of the present disclosure. The chemical agent, for instance, may comprise any suitable chemical agent for microbial control, material protection, wood protection, personal care, or may comprise any suitable performance product. Microbial control agents include, for instance, sanitizers and treatments for recreational, commercial, municipal, and industrial waters. Material protection agents include additives for paints, coatings, building materials, plastics, marine antifouling compositions, textile products, and metal working products. Wood protection agents include wood preservatives, lumber treatments, and the like. Personal care agents include preservatives, anti-dandruff solutions, and any functional material for all types of personal care products. Performance agents include urethanes, polyols, glycols, and related products for coatings, adhesives, sealants, and elastomers. Other chemical agents that may be contained in the packaging system include hydrazine hydrates, propellants, and oleochemical derivatives. Oleochemical derivatives include food emulsifiers that help achieve physical and functional properties of taste, texture and appearance.

The chemical agent may comprise a liquid, gel, paste, and/or solid. For instance, the chemical agent may comprise a solid pourable material, such as a granular material or a powder.

In accordance with the present disclosure, the inner package 12 contains a single dose or measured amount of the chemical agent. For instance, the mass of the chemical agent contained in the inner package 12 can be from about 2 grams to about 500 grams, such as from about 2 grams to about 110 grams. In one particular embodiment, the mass of the chemical agent can be from about 40 grams to about 100 grams.

Particular examples of chemical agents that may be contained in the packaging system include corrosive agents, oxidizers, pesticides such as algaecides, and peroxides. The chemical agent may comprise a dye, colorant, conditioner, fragrance, moisturizer, softener, cleaner, or the like.

In one particular embodiment, the chemical agent 14 comprises a swimming pool chemical. The swimming pool chemical may be contained in the inner package 12 in a controlled measured amount, such as a single dose. In accordance with the present disclosure, the outer package 10 can be opened allowing a consumer to simply dispense the inner package 12 and the chemical agent 14 into a swimming pool. The inner package 12 can be made from a degradable material, such as polyvinyl alcohol that degrades in the aqueous environment. For instance, the inner package 12 may degrade in less than about eight hours, such as less than about four hours, such as less than about one hour. In one embodiment, the inner package 12 can be constructed such that it degrades in less than about 30 minutes, such as less than about 20 minutes, such as less than about 10 minutes, such as even less than about 5 minutes releasing the chemical agent.

In one particular embodiment, the chemical agent comprises 2,2-dibromo-2-cyanoacetamide which is added to swimming pool waters to extend the life of other agents in the pool, such as peroxides.

Figure 4:
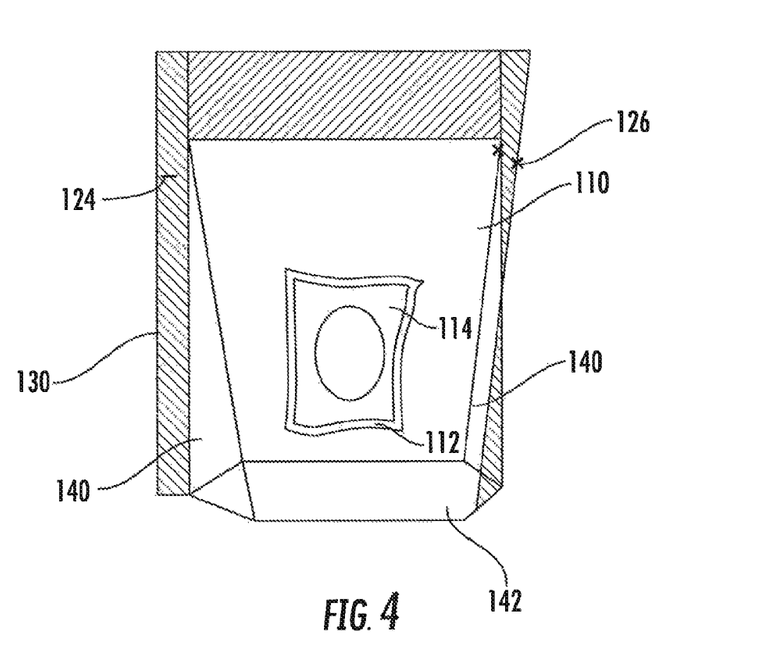
FIGS. 4, 5 and 6 represent an alternative embodiment of a package system made in accordance with the present disclosure.
Figure 5:
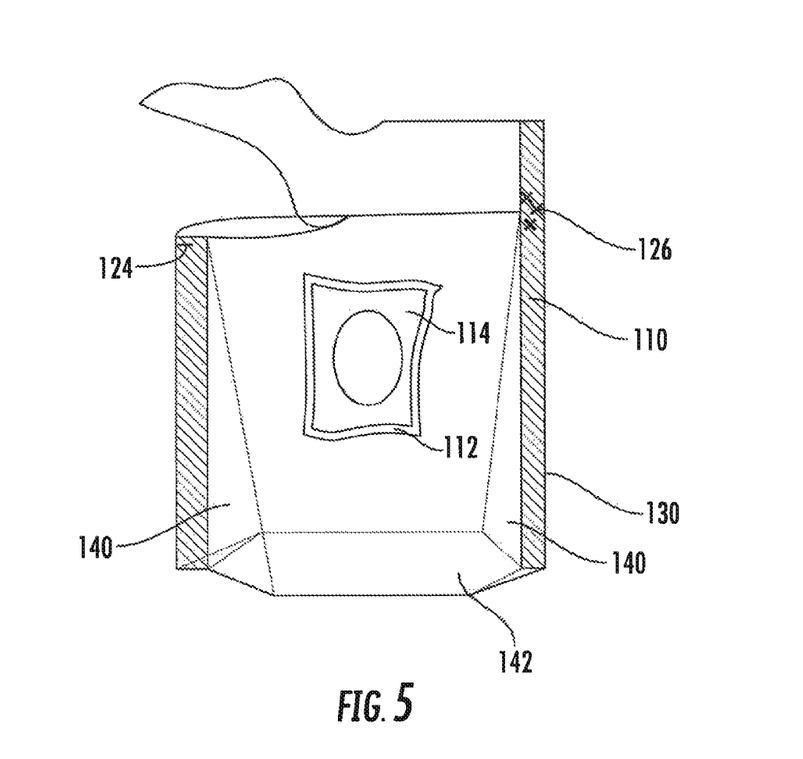
Figure 6:
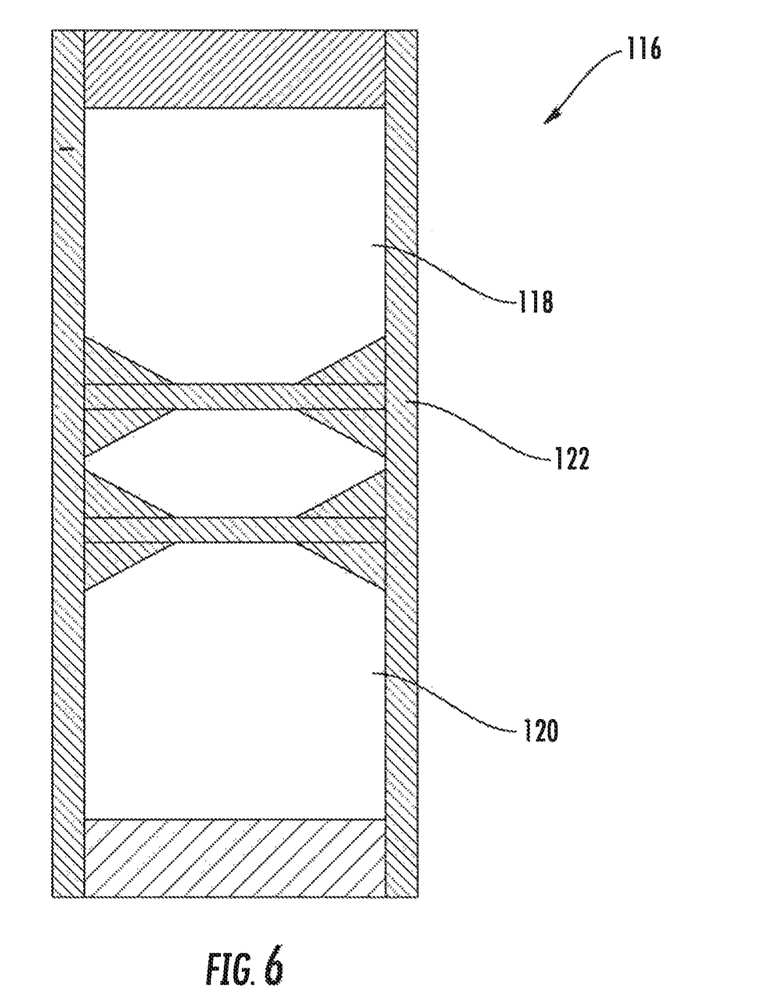

Referring now to FIGS. 4-6, another embodiment of a package system in accordance with the present disclosure is shown. Similar to the embodiment illustrated in FIGS. 1-3, the package system includes an outer package 110 and an inner package 112 that contains a chemical agent 114. The outer package 110 includes a seam 130 that defines the outer periphery. In order to easily open the outer package 110, the outer package includes a tear promoting portion 124. In one embodiment, the tear promoting portion 124 may be aligned with a stop member 126 that prevents the package from being torn into two pieces when opened.

Once the outer package 110 is opened, the inner package 112 can be dispensed into an environment where the inner package degrades and releases the chemical agent 114. The chemical agent 114 can be included in the inner package 112 in a measured amount that comprises a single dose.

Referring to FIG. 6, in one embodiment, the outer package 110 can be formed from a blank 116. The blank 116 can include a first film 118 and a second film 120 that are attached together to form the outer package. In one embodiment, an adhesive material 122 can be applied to the films for attaching the two film layers together.

In the embodiment illustrated in FIGS. 4-6, the outer package 110 includes gussets 140 formed into each side of the package. For instance, as shown in FIG. 6, the adhesive material 122 can be applied to the first film 118 and the second film 120 in order to form the gussets 140. By forming gussets 140, the compartment expands for receiving the inner package 112. In addition, a flat bottom 142 is formed that allows the package to sit upright.

In addition to the packages shown and described previously, it should be understood that the outer package and the inner package can have various forms and shapes. In one embodiment, for instance, the outer package may have a rigid base that defines a compartment. The rigid base may be sealed by a flexible film. For instance, in one embodiment, the package can be vacuum sealed. The outer package may also have a flat bottom and may have sides made from a different material. The inner package, on the other hand, may be made from a water soluble paper. In still another embodiment, the inner package may comprise a gel tab or capsule.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A package system for administering controlled dosages of a chemical comprising:

an outer package comprising a first film attached to a second film, the outer package having a periphery surrounding a compartment having an interior volume, the first film and the second film being attached together at the periphery, the first film and the second film having a moisture vapor transmission rate of less than about 0.5 g/100 in$^2$/24 hrs. and an oxygen transfer rate of less than about 0.5 cc/100 in$^2$/24 hrs., the outer package including a tear promoting portion for facilitating opening of the outer package; and an inner sealed package contained in the compartment of the outer package, the inner package being degradable when exposed to a degrading agent, the inner package containing a measured amount of a chemical agent;

and wherein the outer package maintains a non-degradable environment for the inner package and the chemical agent.

2. A package system as defined in claim 1, wherein the inner sealed package is water degradable.

3. A package system as defined in claim 1, wherein the first film and the second film are comprised of a polyester, a polypropylene, a polyethylene, an oriented polypropylene, a polyvinylidene chloride, or mixtures thereof.

4. A package system as defined in claim 1, wherein the first film and the second film comprise a biaxial oriented polymer film.

5. A package system as defined in claim 4, wherein the biaxial oriented polymer film comprises a crystalline propylene film.

6. A package system as defined in claim 1, wherein the first film layer and the second film layer have a water vapor transmission rate of less than about 0.2 g/100 in$^2$/24 hrs. and have an oxygen transfer rate of less than about 0.45 cc/100 in$^2$/24 hrs.

7. A package system as defined in claim 1, wherein the outer package further comprises a stop member, the tear promoting portion permitting tearing of the package for opening the package until the tear reaches the stop member.

8. A package system as defined in claim 1, wherein the first film and the second film are attached together by an adhesive material.

9. A package system as defined in claim 8, wherein the adhesive material comprises a polyethylene.

10. A package system as defined in claim 8, wherein the adhesive material comprises a laminated structure containing cross-oriented layers of a polymer material.

11. A package system as defined in claim 10, wherein the layer of polymer material comprises polypropylene, polyethylene, polystyrene, or mixtures thereof.

12. A package system as defined in claim 1, wherein the outer package contains a plurality of inner packages, each containing a measured amount of the chemical agent.

13. A package system as defined in claim 1, wherein the first film and the second film comprise multi-layered films.

14. A package system as defined in claim 1, wherein the first film and the second film have a thickness of from about 2 mil to about 5 mil.

15. A package system as defined in claim 1, wherein the inner seal package is made from polyvinyl alcohol.

16. A package system as defined in claim 1, wherein the chemical agent comprises an oxidizer, an algaecide, or a corrosive chemical.

17. A package system as defined in claim 1, wherein the chemical agent comprises a swimming pool maintenance chemical.

18. A package system as defined in claim 1, wherein the chemical agent comprises 2,2-dibromo-2-cyanoacetamide.

19. A package system as defined in claim 1, wherein the measured amount of the chemical agent has a mass of from about 2 grams to about 110 grams.

20. A package system as defined in claim 1, wherein the chemical agent comprises a liquid, a gel, a solid or mixtures thereof.

21. A package system as defined in claim 1, wherein the chemical agent comprises an antimicrobial agent.

22. A package system as defined in claim 1, wherein the chemical agent comprises a wood preservative, a personal care product, or an oleochemical derivative.

* * * * *